United States Patent [19]
Tobita

[11] Patent Number: 4,513,399
[45] Date of Patent: Apr. 23, 1985

[54] SEMICONDUCTOR MEMORY

[75] Inventor: Youichi Tobita, Hyogo, Japan

[73] Assignee: Mitsubishi Denki Kabushiki Kaisha, Tokyo, Japan

[21] Appl. No.: 468,879

[22] Filed: Feb. 23, 1983

[30] Foreign Application Priority Data

Mar. 4, 1982 [JP] Japan .................................. 57-35361

[51] Int. Cl.³ .............................................. G11C 11/40
[52] U.S. Cl. ..................................... 365/189; 365/182
[58] Field of Search ............... 365/189, 230, 154, 182; 307/304

[56] References Cited

U.S. PATENT DOCUMENTS 3,810,124  5/1974  Hoffman ............................ 340/173

Primary Examiner—Terrell W. Fears
Attorney, Agent, or Firm—Lowe King Price & Becker

[57] ABSTRACT

A semiconductor memory comprises a plurality of memory cells (1), each including a switching transistor (3) switched in response to a clock signal through a word line (8, 27) and a storage capacitor (2) for storing data. The data is read out to a bit line (5) in response to the switching of the switching transistor (3). A respective pull-down transistor (21) is connected to the respective word line (8, 27). In response to an ON state of the pull-down transistor (21), the corresponding word line (8) is connected to a voltage generating source (32) for generating a voltage lower than the level of a logical "0" of the data.

6 Claims, 9 Drawing Figures

SEMICONDUCTOR MEMORY

BACKGROUND OF THE INVENTION

1. Field of the Invention

The present invention relates to a semiconductor memory and, more particularly, relates to a pull-down circuit connected to a word line in a random access memory using a field effect transistor (simply referred to as a transistor hereinafter).

2. Description of the Prior Art

FIG. 1 shows a portion of a random access memory using a conventional word line pull-down circuit, in which two bits of memory cells each including a single transistor and a single capacitor per a bit, two decoders for selecting these memory cells, a sense amplifier for amplifying memory cell data and two pull-down circuits for two word lines are shown.

In FIG. 1, a memory cell 1 of a bit comprises a storage capacitor 2 for storing data of a logical "1" or "0" (in this specification "1" or "0" indicates a logical value), one end of the capacitor 2 being connected to a ground, and a switching transistor 3 having a first main electrode connected to the other end of the storage capacitor 2 and reading, writing or holding the data in the storage capacitor 2. The memory cell 1 further includes parasitic capacitance 4 associated with the transistor 3. A bit line 5 connected to a second main electrode of the switching transistor 3 transmits the data in the memory cell 1. A sense amplifier 6 for amplifying the cell data read out into the bit line 5 is shown. A signal $\overline{\phi}_S$ for driving the sense amplifier 6 is applied to a terminal 7. A word line 8 is connected to the gate of the switching transistor 3 so that a signal for controlling ON and OFF of the switching transistor 3 is applied to the word line 8. Parasitic capacitance (9) is shown associated with the word line 8. A decoder circuit (10) for decoding address signals A1, $\overline{A1}$, A2, $\overline{A2}$, . . .An, $\overline{An}$) applied for selecting the memory cell 1 includes terminals 11, . . .11 to which address signals are applied, transistors 12, . . .12 each connected to the corresponding terminal 11 for operating in response to the address signal, the respective transistors 12, . . .12 being connected in parallel with each other, and a charging transistor 14 having one main electrode connected to one end of each of the transistors 12 and for charging an output node 13 of the decoder circuit 10 which is a junction of one main electrode of the transistor 14 and one end of the transistor 12. The gate electrode of the charging transistor 14 is connected to a terminal 15 to which a charging signal $\overline{\phi}$ is applied for controlling the charging transistor 14 and the other main electrode of the charging transistor 14 is connected to a terminal 16 to which a source voltage V is applied. A transistor 17 is connected between the word line 8 and a terminal 19 to which a clock signal $\phi$ is applied, the gate of the transistor 17 being connected to the output node 13 in the decoder 10. The transistor 17 couples the clock signal $\phi$ to the word line 8 in response to the level of the output node 13 in the decoder circuit 10. A capacitor 18 is connected between the output node 13 in the decoder circuit 10 and the word line 8. The capacitor 18 serves as capacitance for boosting the level at the time when the output node 13 in the decoder circuit 10 is "1" level and for transmitting the "1" level of the clock signal $\phi$ to the word line 8 without any drop because of a threshold voltage $V_{TH}$ of the transistor 17. A pull-down circuit 20 for grounding a voltage in a non-selected word line comprises a transistor 21 connected between the word line 8 and a ground, a transistor 22 crossed with the transistor 21, that is, having one main electrode (in this case, a drain) connected to the gate of the transistor 21 and the other main electrode (in this case, a source) connected to a ground and a gate connected to the word line 8 and a charging transistor 23 connected between a terminal 16 to which a source voltage V is applied and one main electrode of the transistor 22 and having a gate connected to a terminal 15 to which a clock signal $\overline{\phi}$ is applied. The charging transistor 23 renders a transistor 21 conductive or ON to connect the word line 8 to a ground when the memory cell 1 is in a non-selected state. A decoder circuit 24 for selecting the same memory cell 28 as the above described memory cell 1 has the same structure as the above described decoder circuit 10 but has a different response to an address signal. Reference numeral 25 denotes an output node of the decoder circuit 24 and reference numeral 26 denotes a transistor connected between the terminal 19 to which a clock signal $\phi$ is applied and a word line 27 and operating in the same manner as the above described transistor 17. The transistor 26 couples the word line 27 of the memory cell 28 to the clock signal $\phi$ in response to the level of the output node 25 in the decoder circuit 24. The reference numeral 29 denotes a storage node in the memory cell 28, the reference numeral 30 denotes parasitic capacitance of the word line 27 and the reference numeral 31 denotes a pull-down circuit for the word line 27 which has the same structure as the above described pull-down circuit 20.

Now referring to waveforms of FIG. 2, an operation of a circuit in FIG. 1 will be described.

It is assumed herein that the data "0" is stored in the memory cell 1, the data "1" is stored in the memory cell 28 and now the data "0" stored in the memory cell 1 is going to be read out.

A period from the time $t_0$ to $t_1$ in FIG. 2 is a precharge period for the memory system. During the precharge period, the respective output nodes 13 and 25 of the decoder circuits 10 and 24 and the gates of the transistors 21 in the pull-down circuits 20 and 31 are precharged in response to the clock signal $\overline{\phi}$. Since the clock signal $\phi$ is a ground level of "0" at that time, the word lines 8 and 27 are grounded through the transistors 17 and 26 and the transistors 21 in the pull-down circuits, respectively. Accordingly, each switching transistor 3 in both memory cells 1 and 28 is in an OFF state and hence the cell data is in a holding state. If and when an address input is applied to the respective terminals 11 of the decoder circuits 10 and 24 at the time point $t_2$ after the clock signal $\overline{\phi}$ becomes "0" at the time point $t_1$, the memory cell 1 is selected. As a result, the output node 25 in the decoder circuit 24 becomes "0" level through the transistor 12 and the output node 13 in the decoder circuit 10 is still held in the "1" level. Accordingly, the transistor 26 turns to the OFF state with the transistor 17 being held in the ON state. At that time, the word lines 8 and 27 are "0" since the clock signal $\phi$ is "0" level and each transistor 21 in the pull-down circuits 20 and 31 is in the ON state.

At the time point $t_3$, the clock signal $\phi$ becomes "1" and hence the word line 8 is charged through the transistor 17. At that time, although the word line 8 is grounded by the transistor 21 in the pull-down circuit 20, the voltage in the word line 8 progressively increases with increase of the clock signal since the ON resistance in the transistor 17 is set to be smaller than the ON resistance of the transistor 21 in the pull-down circuit 20. Then, if and when the voltage in the word line 8 exceeds the threshold voltage $V_{TH}$ of the transistor 22, the transistor 22 is rendered conductive and the transistor 21 is rendered non-conductive or OFF, whereby the voltage in the word line 8 follows a variation of the clock signal $\phi$ and hence increases. As the voltage in the word line 8 increases, the output node 13 in the decode circuit 10 is boosted to over $V+V_{TH}$ through the bootstrap capacitance 18 in the decoder circuit 10 and hence the voltage in the word line 8 increases up to the "1" level (=V) of the clock signal $\phi$ without any drop of the amount of the threshold voltage of the transistor 17. On the other hand, since the transistor 26 is being in the OFF stage, the word line 27 is held to be grounded by the transistor 21. Then, the transistor 3 is rendered conductive in response to the voltage in the word line 8, so that the data "0" in the memory cell 1 is read out to the bit line 5. A variation of the voltage in the bit line at that time is shown in FIG. 2. More particularly, the word line 8 and the bit line 5 are coupled to each other by the parasitic capacitance 4 in the memory cell 1 and the voltage in the bit line 5 increases at the rising time of the word line 8 and thereafter gradually decreases in response to a read signal from the memory cell 1. If and when the clock signal $\overline{\phi_S}$ is applied at the time point of $t_4$, a fine amplitude of the voltage appearing in the bit line 5 is amplified by the sense amplifier 6 and the level of the bit line 5 becomes "0", that is, a ground level.

A reading out of the cell is completed at the time of $t_5$ and the clock signal $\phi$ becomes "0". At the same time, the voltage in the word line 8 becomes "0". However, at that time the word line 8 and the bit line 5 are coupled to each other by the parasitic capacitance 4 in the memory cell 1 and thus the voltage in the bit line 5 is decreased. The voltage becomes less than $-V_{TH}$ as shown in FIG. 2. In case where the voltage is less than $-V_{TH}$, which is equivalent to the state where a voltage more than the threshold voltage $V_{TH}$ of the switching transistor 3 in the memory cell 28 is applied between the gate (word line 27) and one main electrode (in this case, a source electrode)(bit line 5) in the switching transistor 3 in the memory cell 28, the switching transistor 3 is rendered conductive and hence the charge stored in the storage node 29 in the memory cell 28 is discharged through the switching transistor 3 so that the voltage in the storage node 29 is decreased (see $\Delta V$ in FIG. 2). If the above described series of operations are repeated, the voltage in the storage node 29 in the memory cell 28 is gradually decreased and finally the data of "1" is changed to "0". In order to prevent this phenomenon, it would be preferred to make the threshold voltage in the switching transistor 3 larger so that the switching transistor 3 is made difficult to be rendered conductive. Nevertheless, if the threshold voltage is made larger, a voltage written into the memory cell becomes smaller by an amount of an increase of the threshold voltage. As a result, an inconvenience occurs where a signal level at the time of reading out of the data decreases.

SUMMARY OF THE INVENTION

The present invention is directed to a semiconductor memory. A semiconductor memory in accordance with the present invention comprises a plurality of memory cells each including a switching transistor and a storage capacitor connected to a first main electrode of the switching transistor, bit lines for transmitting data stored in said storage capacitor, each bit line being connected to a second main electrode of the corresponding switching transistor in the memory cells, and a word line for transmitting a clock signal for controlling an ON/OFF state in the switching transistor and connected to the gate of the switching transistors. The present semiconductor memory further comprises word line pull-down circuits including a pull-down transistor, each pull-down circuit being provided corresponding to each of said plurality of memory cells. The pull-down transistor included in each of the pull-down circuits has a first main electrode connected to the word line, and a second main electrode connected to a voltage source for generating a voltage lower than a logical "0" level of the data being transmitted through the bit line. A control signal for controlling an ON/OFF state in the pull-down transistor is applied to the gate of the corresponding pull-down transistor.

In a preferred embodiment of the present invention, a clock signal applied to a word line is adapted such that the level of "0" is a high impedance.

Accordingly, an object of the present invention is to provide a semiconductor memory capable of reducing adverse effect due to noise from a memory cell in a selected state, without changing a threshold voltage $V_{TH}$ of the switching transistor included in the memory cell.

These objects and other objects, features, aspects and advantages of the present invention will become more apparent from the following detailed description of the present invention when taken in conjunction with the accompanying drawings.

DETAILED DESCRIPTION OF THE PREFERRED EMBODIMENTS

The following preferred embodiment of the present invention will be described referring to FIG. 3. Although in the embodiment only two memory cells are used, it is for indicating a principle of the present invention and thus it is not intended to limit such embodiment.

Figure 1:
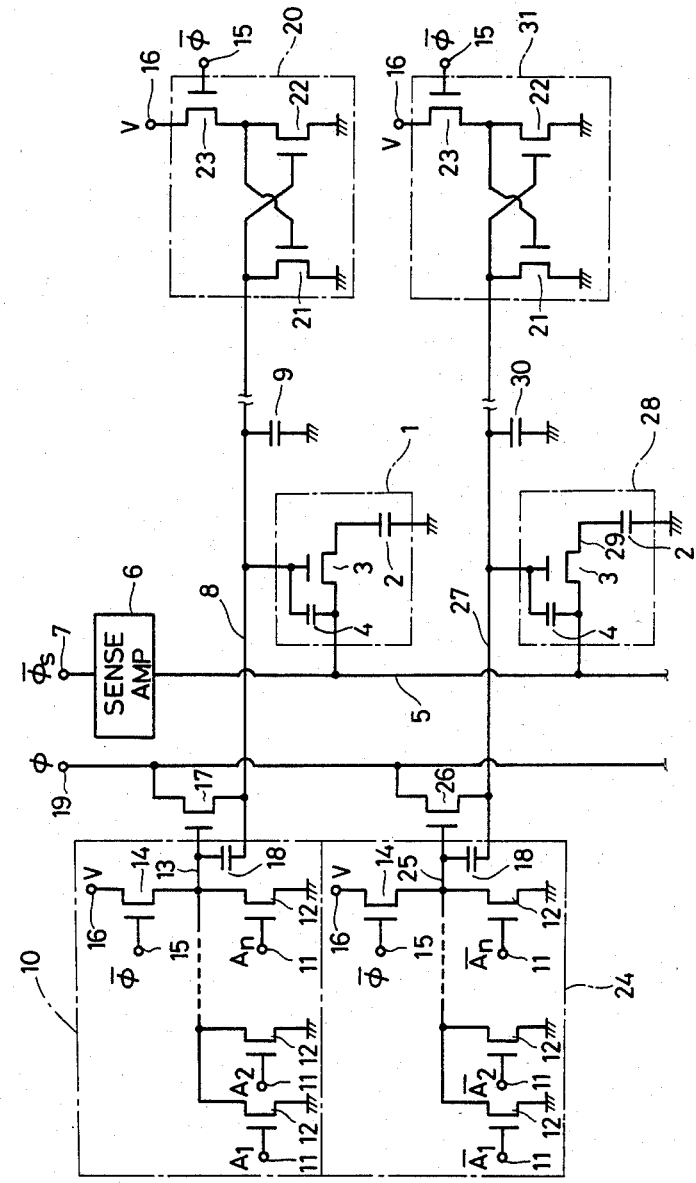
FIG. 1 is an essential part of a circuit of a random access memory system comprised of memory cells of 2 bits in accordance with a conventional technique.
Figure 2:
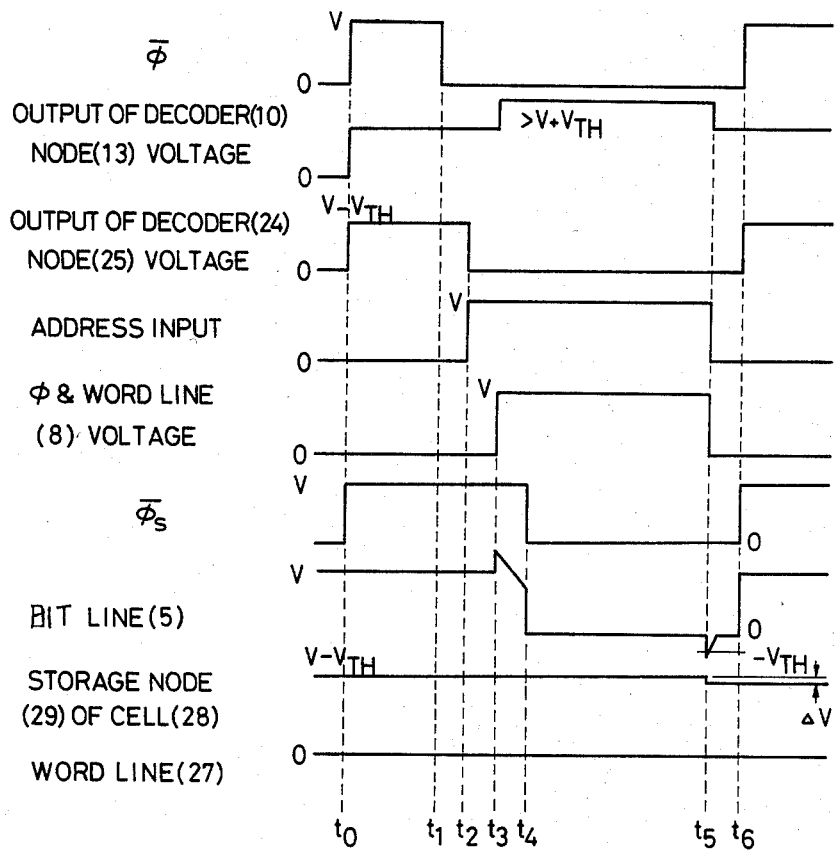
FIG. 2 is a timing diagram showing waveforms of signals in each portion of the circuit in FIG. 1.
Figure 3:
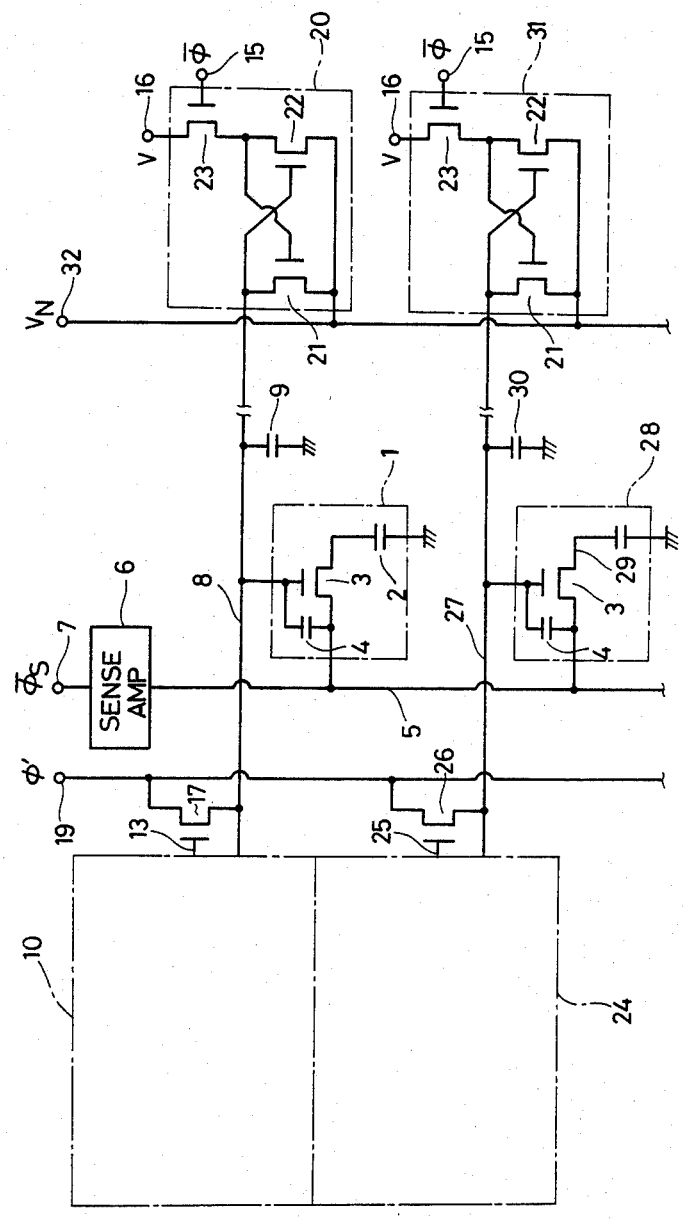
FIG. 3 is an essential part of a circuit of a random access memory system comprised of memory cells of 2 bits in accordance with one embodiment of the present invention.

In FIG. 3, the same reference numerals as those in FIG. 1 indicate the same or similar portions. The points different from the structure of FIG. 1 are that each one main electrode (in this case, a source electrode) of each of the transistors 21 and 22 included in the pull-down circuit 20 is connected to a terminal 32 connected to a voltage source for generating a predetermined voltage $V_N$, (in this case, $-V_{TH}$) less than a ground voltage and similarly each main electrode (in this case, a source electrode) of each of the transistors 21 and 22 included in the pull-down circuit 31 is connected to the terminal 32 and that clock signal $\phi'$ is a clock signal having the same timing as that in the clock signal $\phi$ as shown in FIG. 1 and the "0" level is a high impedance.

An operation of the thus structured memory will be described referring to waveforms of FIG. 4.

It is also assumed that the data of "0" is stored in the memory cell 1, the data of "1" is stored in the memory cell 28 and the data of "0" stored in the memory cell 1 is going to be read out. Accordingly, since a basic circuit operation is substantially the same as that in FIG. 1, only a different operation, that is, the voltages in the word lines 8 and 27 will be mainly described.

Figure 4:
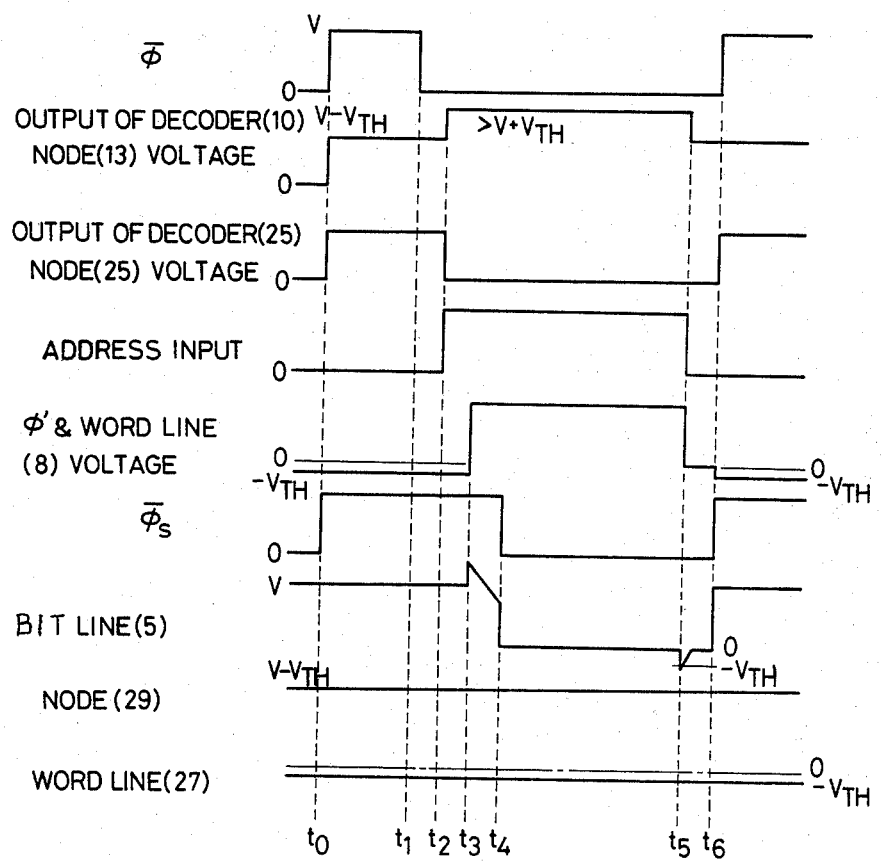
FIG. 4 is a timing diagram showing signal waveforms in each portion of the circuit in FIG. 3.

During a period between the time points $t_0$ and $t_1$ in FIG. 4, the word lines 8 and 27 are rendered to be $-V_{TH}$ level which is a voltage generated from a voltage source, since each transistor 21 in the pull-down circuits 20 and 31 is in an ON state. At the same time, the clock signal $\phi'$ is also rendered to be $-V_{TH}$ level since the transistors 17 and 26 are also in an ON state. The reason is that the clock signal $\phi'$ is in a high impedance state of "0" during this period.

The same operation as that in FIG. 1 is performed during a period from the time point $t_1$ to $t_3$. When the level of the clock signal $\phi'$ is changed from "0" to "1" at the time point $t_3$, the voltage in the word line 8 gradually increases through the transistor 17 with increase of the clock signal $\phi'$. Then, if and when the voltage in the word line 8 exceeds the threshold voltage of the transistor 22 in the pull-down circuit 20, the transistor 22 is rendered conductive and the transistor 21 is rendered non-conductive, so that the voltage on the word line 8 follows the clock signal $\phi'$ to increase up to "1". Although the voltage $V_N$ from the voltage source is instantaneously increased through the transistor 21 in the pull-down circuit 20 before the level of the clock signal $\phi'$ increases from "0" to "1", the parasitic capacitance 30 associated with the word line 27 connected to the non-selected memory cell 28 (although only one parasitic capacitance is shown, there is much parasitic capacitance associated with a number of word lines, for example, 256 word lines in a memory of 64 K bits) serves as a large decoupling capacitance through the transistor 21 in the pull-down circuit 31 and therefore, the voltage $V_N$ hardly changes from the $-V_{TH}$. Accordingly, the voltage on the word line 27 is held in the state of the $-V_{TH}$ in the light of the fact that the transistor 26 is in the OFF state. Thereafter, if and when the data "0" in the memory cell 1 is read out and the clock signal $\phi'$ is changed from "1" to "0" at the time point $t_5$, the word line 8 changes to a ground level of a high impedance through the transistor 17. Although, at that time, the voltage on the bit line 5 decreases to less than $-V_{TH}$ since the word line 8 and the bit line 5 are coupled to each other by the parasitic capacitance 4 in the memory cell 1, the switching transistor 3 in the memory cell 28 is not rendered on since the voltage on the word line 27 is $-V_{TH}$. Thus, decrease of the voltage in the storage node 29 in the memory cell 28 does not occur and hence the memory cell 28 continues to store the data "1".

Thereafter, if and when the clock signal $\overline{\phi}$ changes from "0" to "1" at the time point of $t_0$, the transistor 14 in the decoder circuit 24 is rendered conductive, the transistor 26 is rendered conductive and the transistor 23 in the pull-down circuit 20 is also rendered conductive. As a result, the transistor 21 is also rendered conductive and hence the clock signal $\phi'$ and the word line 8 changes from the ground level to $-V_{TH}$. Thus, the memory comes to wait for a subsequent operation.

As described in the foregoing, since the present semiconductor memory comprises a word line pull-down circuit including a transistor having one main electrode connected to the word line and the other main electrode connected to a voltage source for generating a predetermined voltage less than a ground voltage, a voltage on the word line in a non-selected memory cell becomes a predetermined voltage less than the ground voltage and hence an adverse effect to a non-selected memory cell due to noise from a selected memory cell can be reduced. Correspondingly, a threshold voltage of the switching transistor in a memory cell can be made small and a signal read out from the memory cell can be made large.

Figure 5:
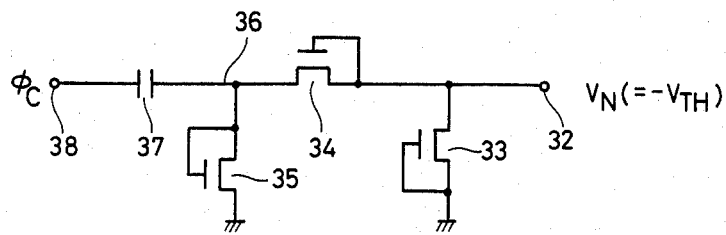
FIG. 5 is a circuit diagram showing an example for generating a predetermined voltage $V_N$ in FIG. 3.

FIG. 5 shows in detail a circuit of a voltage source, as shown in FIG. 3, for generating a predetermined voltage $V_N$ less than a ground voltage. The voltage source can be formed on the same substrate, together with memory cells, decoder circuits and pull-down circuits. In FIG. 5, the voltage source comprises a clamping transistor 33 for clamping an output voltage to $-V_{TH}$ and connected between an output terminal 32 and a ground, the gate of the transistor 33 being connected to the ground, a first rectifying transistor 34 having one main electrode and a gate connected to the output terminal 32, a second rectifying transistor 35 having one main electrode and a gate connected to the other main electrode of the first rectifying transistor 34 and having the other main electrode connected to the ground, and coupling capacitance 37 connected between a terminal 38 to which a clock signal $\phi_C$ is applied and the other main electrode of the first rectifying transistor 34.

An operation of the voltage source shown in FIG. 5 will be described. In general, a circuit arrangement having no clamping transistor 33 is well known. For example, let it be assumed that an amplitude of the voltage of the clock signal $\phi_C$ is V and the threshold voltage of the first and second rectifying transistors 34 and 35 are $V_{TH}$, a negative voltage of $-(V-2V_{TH})$ appears in the output terminal 32. If and when the clamping transistor 33 is connected to the output terminal 32 as shown in FIG. 5, an electric current flows through the clamping transistor 33 from the ground in case where the voltage of the output terminal 32 is more negative than $-V_{TH}$, and thus the voltage of the output terminal 32 is clamped to $-V_{TH}$. More particularly, a constant voltage of $-V_{TH}$ is supplied to the output terminal 32.

Figure 6:
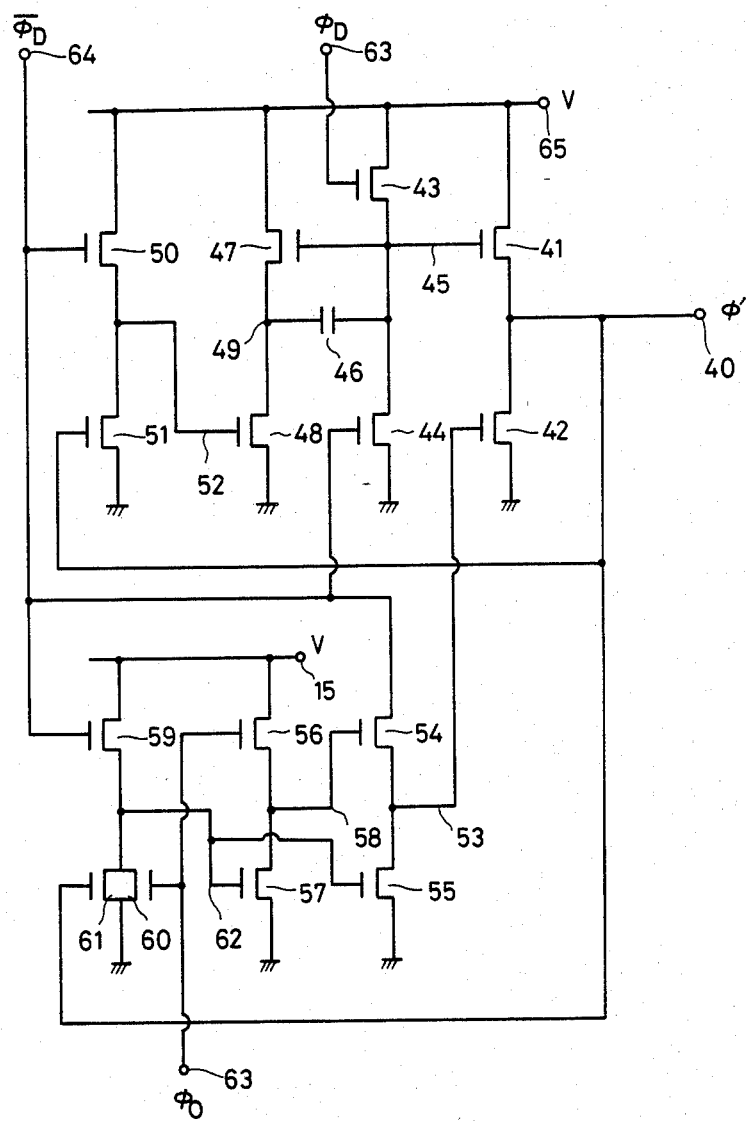
FIG. 6 is a circuit diagram showing an example for generating a clock signal $\phi'$ in FIG. 3.

In addition, FIG. 6 shows an example of a clock signal generating circuit for generating a clock signal $\phi'$, as shown in FIG. 3, which has the same timing as that in the clock signal shown in FIG. 1, but the "0" level of which is a high impedance. In FIG. 6, a load transistor 41 is connected between a power source 65 and an output terminal 40 for outputting a clock signal $\phi'$. A driver transistor 42 of an output stage is connected between the output 40 and a ground. A transistor 43 for charging a gate of the load transistor 41 is connected between the power source and a node 45 and is controlled by the clock signal $\phi_D$. A transistor 44 for discharging the gate of the load transistor 41 is connected between the node 45 and the ground. An output node 45 is a node for a charging and discharging circuit comprising transistors 43 and 44. A bootstrap capacitor 46 for boosting the gate of the load transistor 41 is connected between the node 45 and a node 49. A load transistor 47 is a transistor for a bootstrap circuit boosting the gate of the load transistor 41 and is connected between a power supply and the node 49. A driver transistor 48 is connected between the node 49 and the ground. A load transistor 50 is included in a delay circuit for making the bootstrap circuit effectively operate. The load transistor 50 is controlled by a clock signal $\overline{\phi_0}$ and is connected between the power supply and the node 52. A driver transistor 51 thereof is connected between an output node 52 and the ground. Reference numeral 53 is an output node of a circuit for generating a signal temporarily rendering the driver transistor 42 conductive. A load transistor therefor is connected between the clock signal $\overline{\phi_0}$ and the node 53. A driver transistor 55 therefor is connected between the node 53 and the ground. A transistor 56 for charging the gate of the load transistor 54 is controlled by the clock signal $\phi_0$ and is connected between the power supply and the node 58. A transistor 57 for discharging the gate of the load transistor 54 is connected between the ground and the node 58 for charging and discharging circuit comprising the transistors 56 and 57. A transistor 59 for controlling the driver transistor 55 and the transistor 57 in response to the clock signal $\phi_0$ is connected between a power supply and a node 62. A transistor 60 for discharging the node 62 is controlled in response to the clock signal $\phi_0$ and is connected between the node 62 and the ground. A transistor 61 for discharging the node 62 is controlled in response to the clock signal $\phi'$ and is connected between the node 62 and the ground. 63 is a terminal to which a clock signal $\phi_0$ is applied, 64 is a terminal to which a clock signal $\overline{\phi_0}$ is applied and 65 is a terminal to which a power source V is applied.

Figure 7:
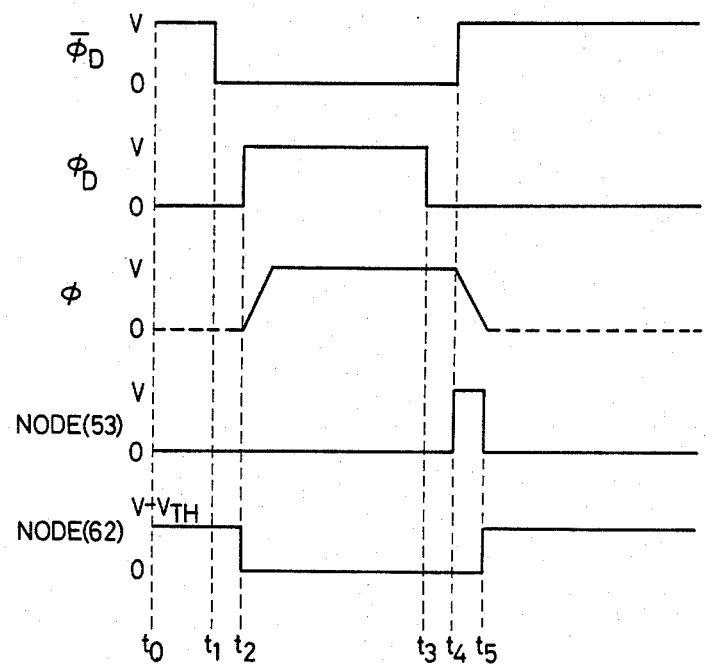
FIG. 7 is a timing diagram showing signal waveforms in each portion of the circuit in FIG. 6.

In the thus structured clock signal generating circuit, an operation for obtaining a clock signal $\phi'$ will be described referring to waveforms shown in FIG. 7. First, since a clock signal $\overline{\phi_0}$ is "1" and clock signal $\phi_0$ is "0" during a period between the time points $t_0$ and $t_1$, the node 45 is "0", the node 62 is charged through the transistor 59 and thus is "1", hence the node 53 is "0" and the node 52 is also charged to "1". Since the transistors 41 and 42 are rendered non-conductive, the output node 40 (corresponding to the clock signal $\phi'$) is in a high impedance state and is "0" if the level before $t_0$ is "0".

Even if the clock signal $\overline{\phi_0}$ becomes "0" at the time point of $t_1$, the nodes 52 and 62 are held in a state charged to "1". If and when the clock signal $\phi_0$ becomes "1" at $t_2$, the transistor 43 is rendered conductive in response to the clock signal $\phi_0$ and hence the node 45 is charged, the transistor 41 is rendered conductive and the level of the node 40 is increased, so that the transistor 51 is rendered conductive and the node 52 changes from "1" to "0". As a result, the transistor 48 is rendered OFF and the level of the node 49 changes from "0" to "1". This change is transmitted to the node 45 through the capacitor 46 so that the level of the node 45 is increased to over $V+V_{TH}$. As a result, the level of the clock signal $\phi'$ increases up to V. On the other hand, since the node 62 becomes "0" through the transistor 60 so that the transistors 55 and 57 are rendered non-conductive, the node 58 is charged to "1" by the transistor 56 and the transistor 54 is rendered conductive. However, since the clock signal $\overline{\phi_0}$ at that time is "0", the node 53 is still "0". Then, since the transistor 44 remains in an OFF state even if the clock signal $\phi_0$ becomes "0" at $t_3$, the node 45 does not discharge and hence the clock signal $\phi'$ remains V. If and when the clock signal $\overline{\phi_0}$ becomes "1" at the time point $t_4$, the node 45 becomes "0" through the transistor 44, the transistor 42 is rendered conductive in response to the clock signal $\phi_0$ through the transistor 54 and the clock signal $\phi'$ is grounded. Then, if and when the clock signal $\phi'$ becomes "0", the transistor 61 is rendered non-conductive so that the level of the node 62 depressed by the transistor 61 increases and the transistors 55 and 57 are rendered conductive at the time point of $t_5$ and hence the node 53 becomes "0". Then, in response to the "0" of the node 53, the clock signal $\phi'$ becomes "0" state of a high impedance (see a dotted line in FIG. 7). As a result, a clock signal having the same timing as that in the clock signal $\phi$ shown in FIG. 1 but having the "0" level of a high impedance is obtained.

Meanwhile, if the clock signal $\phi'$ generating circuit is used in the circuit shown in FIG. 3, the voltage level of the clock signal $\phi'$ is decreased down to $-V_{TH}$ (till time point $t_3$ and a period after the time point $t_0$ shown in FIG. 4). However, since the transistors 41 and 42 are in an intermediate state between the ON and OFF states and thus the electrical current hardly flows, a problem that a consumed power increases does not occur.

Figure 8:
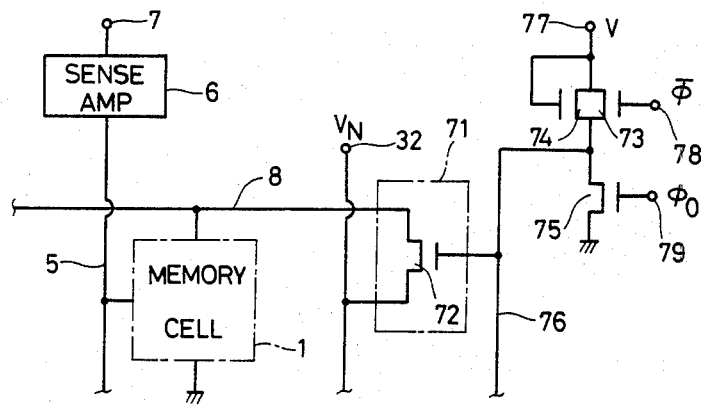
FIG. 8 is an essential part of a circuit showing another embodiment of the present invention.

FIG. 8 shows an essential part of a circuit showing other embodiment of the present invention in which only one word line circuit is shown. In FIG. 8, a pull-down circuit 71 comprises a pull-down transistor 72 having one main electrode connected to a word line 8 and the other main electrode connected to a voltage generating source for generating a predetermined voltage $V_N$ which is less than a ground voltage. A charging transistor 73 is connected between a power supply V and a node 76 which is an end of gate electrode of the pull-down transistor 72 and is controlled in response to the clock signal $\overline{\phi}$ and a load transistor 74 is connected between the power supply and the node 76. A driver transistor 75 is connected between the ground and the node 76. There are also shown a power supply terminal 77, a terminal 78 for clock signal $\phi$ and a terminal 79 for a clock signal $\phi_0$.

In the thus structured embodiment, the operation thereof is almost similar to the embodiment of FIG. 4. While the clock signal $\overline{\phi}$ is "1", that is, during a precharge period, the charging transistor 73 is rendered conductive and correspondingly the node 73 becomes "1" level of $V-V_{TH}$ so that the pull-down transistor 72 is rendered conductive and the word line 8 is made to be predetermined voltage $V_N$ (in this case, $-V_{TH}$). Then, in an operation of reading out of the memory cell 1, a little before a selected word line 8 becomes "1" after the clock signal $\overline{\phi}$ changed from "1" to "0", the clock signal $\phi_0$ becomes "1", so that the voltage on the node 76 becomes slightly higher than the ground level, which is determined by the ratio of ON resistances of the load transistor 74 and the driver transistor 75. Accordingly, although the pull-down transistor 72 becomes slightly conductive, which state is rather close to the off state, the impedance of the pull-down transistor 72 is relatively high. As a result, the voltage on the word line 8 selected for reading out increases up to approximate V so that the data stored in the memory cell 1 can be read out. The voltage on the non-selected word line is $-V_{TH}$. Thus, an adverse effect to the non-selected memory cell due to noise from the selected memory cell after completion of a reading-out can be reduced in the same manner as FIG. 3, and in addition, a signal read out from the memory cell can be made larger.

Figure 9:
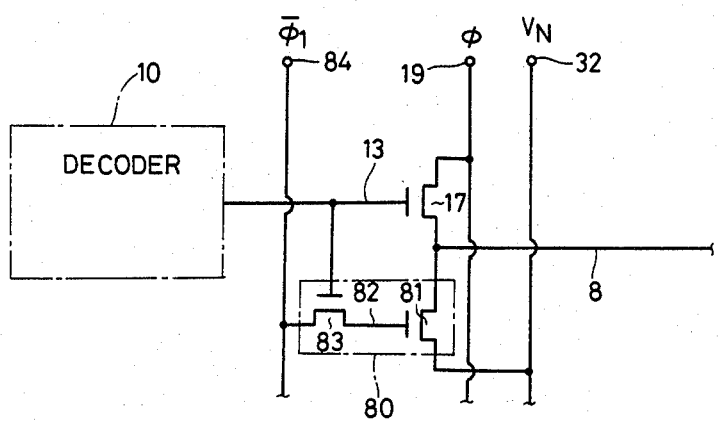
FIG. 9 is a circuit diagram showing a further embodiment of the present invention.

FIG. 9 is an essential part of a circuit showing another embodiment of the present invention, in which only one word line circuit is shown.

In FIG. 9, a pull-down circuit 80 comprises a pull-down transistor 81 having one main electrode connected to the word line 8 and the other main electrode connected to a voltage source for generating a predetermined voltage $V_N$ which is less than a ground voltage, and a transistor 83 having one main electrode connected to the gate of the pull-down transistor 81, the other main electrode connected to a terminal 84 for the clock signal $\overline{\phi}_1$ and a gate connected to an output node 13 of the decoder circuit 10. The clock signal $\overline{\phi}_1$ changes from "1" to "0" after an output from the decoder circuit changes.

An operation of the circuit shown in FIG. 9 is almost similar to that in FIG. 4. During a precharge period, the output node 13 and the clock signal $\overline{\phi}_1$ are both "1" and hence "1" appears in the node 82 through the transistor 83. As a result, the pull-down transistor 81 is rendered conductive and hence the word line 8 is made to be a predetermined voltage $V_N$ (in this case, $-V_{TH}$). In the following, the case where the memory cell connected to the word line 8 is selected and the case where the memory cell is not selected will be described. In case where the memory cell is selected, the output node from the decoder circuit 10 is "1". If the clock signal $\overline{\phi}_1$ changes from "1" to "0" at that time, the node 82 becomes a ground level through the transistor 83 and the pull-down transistor 81 becomes an intermediate state between the ON and OFF states so that the ON resistance thereof is a very much high. If the clock signal $\phi$ changes from "0" to "1" at that time, the word line 8 also changes from "0" to "1" through the transistor 17 at the same time. Accordingly, the data stored in the memory cell is read out. In case where the memory cell is not selected, the output node from the decoder circuit 10 changes from "1" to "0". Since the transistor 83 is rendered non-conductive even if the clock signal $\phi_1$ changes from "1" to "0" at that time, the node 82 holds the "1" level and the pull-down transistor 81 remains in the ON stage. In addition, since the transistor 17 is rendered non-conductive, the voltage on the word line 8 is $-V_{TH}$ level.

Therefore, since the voltage on the selected word line 8 is $-V_{TH}$, an adverse effect to the non-selected memory cell due to noise from the selected memory cell can be reduced and in addition, a signal read out from the memory cell can be made larger.

As described in the foregoing, since there is provided transistor having one main electrode connected to a word line connected to a plurality of memory cells, the other main electrode connected to a voltage source for generating a predetermined voltage less than a ground voltage and a gate electrode connected to a control signal source, the present invention brings about a specific meritorious effect that a voltage on a word line for a memory cell in a non-selection state can be made to be a predetermined voltage less than a ground voltage and hence an adverse effect to a memory cell in a non-selection state due to noise from the memory cell in a selection state can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory comprising
   a plurality of memory cells, each comprising a switching transistor having first and second main electrodes and a gate electrode, and storage capacitance connected to the first main electrode of said switching transistor,
   a bit line connected to the second main electrode of said switching transistor for transmitting the data stored in said storage capacitance,
   a clock source for generating a clock signal for controlling ON/OFF states of said switching transistors,
   word lines connected to the gate of said switching transistor for transmitting said clock signal,
   a decoder circuit for selecting a word line out of said word lines to apply said clock signal to the gate of corresponding said switching transistor,
   a voltage source for generating a voltage lower than the level of a logical "0" of the data to be transmitted through said bit line,
   word line pull-down circuits each including a pull-down transistor having a first main electrode connected to said corresponding word line and a second main electrode connected to said voltage source, and
   controlling signal supplying means for supplying to a gate of said pull-down transistor a controlling signal for controlling the impedance state of the pull-down transistor.

2. A semiconductor memory in accordance with claim 1, wherein
   the clock signal applied to said word lines is adapted such that the logical "0" level is a high impedance.

3. A semiconductor memory in accordance with claim 1, wherein
   said voltage source comprises
   a clamping transistor having a first main electrode connected to an output terminal of said voltage source and a second main electrode and a gate connected to a ground,
   a first rectifying transistor having a first main electrode and a gate connected to said output terminal,
   a second rectifying transistor having a first main electrode and a gate connected to a second main electrode of said first rectifying transistor and also having a second main electrode connected to the ground, and
   coupling capacitance between an input terminal of said voltage source to which a clock signal having an appropriate voltage amplitude is applied and the second main electrode of said first rectifying transistor.

4. A semiconductor memory in accordance with claim 1, wherein
   said control signal supplying means for supplying said control signal to the gate of said pull-down·transistor comprises
   a driver transistor having a first main electrode connected to the gate of said pull-down transistor, a second main electrode connected to said voltage source and a gate connected to said word line, and a charging transistor having a first main electrode connected to a constant voltage source, a second main electrode connected to the first main electrode of said driver transistor and a gate coupled to an inverted clock signal of said clock signal.

5. A semiconductor memory in accordance with claim 1, wherein said control signal supplying means comprises a driver transistor having a first main electrode connected to the gate of said pull-down transistor, a second main electrode connected to the ground and a gate coupled to a desired clock signal, a charging transistor having a first main electrode connected to a constant voltage source, a second main electrode connected to the first main electrode of said driver transistor and a gate coupled to an inverted clock signal of said clock signal, and a load transistor having a first main electrode and a gate connected to said constant voltage source and a second main electrode connected to the second main electrode of said charging transistor.

6. A semiconductor memory in accordance with claim 1, wherein said control signal supplying means comprises a transistor having a first main electrode connected to the gate of said pull-down transistor, a second main electrode and a gate connected to the output node of said decoder circuit, the clock signal changing from the logical "0" to the logical "1" after change of the output from said decoder circuit being applied to the second main electrode of said transistor.

* * * * *